US008022479B2

(12) United States Patent
Nozu

(10) Patent No.: US 8,022,479 B2
(45) Date of Patent: Sep. 20, 2011

(54) SEMICONDUCTOR APPARATUS

(75) Inventor: Tetsuro Nozu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 513 days.

(21) Appl. No.: 12/128,289

(22) Filed: May 28, 2008

(65) Prior Publication Data

US 2008/0296684 A1 Dec. 4, 2008

(30) Foreign Application Priority Data

May 29, 2007 (JP) .................................. 2007-141668

(51) Int. Cl.
*H01L 29/788* (2006.01)
(52) U.S. Cl. ................. 257/355; 257/E27.051
(58) Field of Classification Search ........... 257/E27.051, 257/355–363, 109, 110, 605, 606, 328, 481, 257/570; 360/323
See application file for complete search history.

(56) References Cited

U.S. PATENT DOCUMENTS

| 5,973,359 | A | 10/1999 | Kobayashi et al. | |
|---|---|---|---|---|
| 6,172,383 | B1 | 1/2001 | Williams | |
| 6,323,518 | B1* | 11/2001 | Sakamoto et al. | 257/330 |
| 6,441,463 | B2 | 8/2002 | Yasuda | |
| 6,750,507 | B2* | 6/2004 | Williams et al. | 257/328 |
| 7,511,357 | B2* | 3/2009 | Hshieh | 257/551 |

FOREIGN PATENT DOCUMENTS

| JP | 7-122712 | 5/1995 |
|---|---|---|
| JP | 7-326743 | 12/1995 |
| JP | 2000-91344 | 3/2000 |

OTHER PUBLICATIONS

Office Action issued Sep. 11, 2009 in Japanese Patent Application No. 2007-141668 filed May 29, 2007 (w/English language translation).

* cited by examiner

*Primary Examiner* — Kiesha Bryant
*Assistant Examiner* — Mark Tornow
(74) *Attorney, Agent, or Firm* — Oblon, Spivak, McClelland, Maier & Neustadt, L.L.P.

(57) ABSTRACT

A semiconductor apparatus includes a semiconductor substrate, an insulating film provided on the semiconductor substrate, and a semiconductor film provided on the insulating film. The semiconductor substrate includes a region of a first current path including at least one diode, the semiconductor film includes a region of a second current path including at least one diode, the first current path and the second current path are connected in parallel to each other, the region of the first current path includes at least part of an area directly below the region of the second current path, and the first current path has a higher resistance than the second current path.

9 Claims, 12 Drawing Sheets

SEMICONDUCTOR APPARATUS

CROSS-REFERENCE TO RELATED APPLICATIONS

This application is based upon and claims the benefit of priority from the prior Japanese Patent Application No. 2007-141668, filed on May 29, 2007; the entire contents of which are incorporated herein by reference.

BACKGROUND OF THE INVENTION

1. Field of the Invention

This invention relates to a semiconductor apparatus, and more particularly to a semiconductor apparatus including a protection device.

2. Background Art

With the recent increase in speed and capacity in the information processing technology, there has been a growing demand for frequency enhancement and downsizing on semiconductor apparatuses. In this context, MOS (metal oxide semiconductor) transistors widely used for e.g. fast switching devices or voltage converter circuits also undergo device downsizing and thinning of the gate insulating film, causing concern about the decrease of ESD (electrostatic discharge) capability. Hence there is also a rapidly growing demand for the enhancement of electrostatic breakdown capability on semiconductor apparatuses.

In a semiconductor apparatus including a MOS transistor, when the MOS transistor is formed in a silicon substrate, an ESD protection diode is often formed simultaneously. For example, in the technique disclosed in JP-A 2000-091344 (Kokai), a polycrystalline silicon layer is formed on a silicon substrate. P-type layers and N-type layers are alternately arrayed in the polycrystalline silicon layer to form six stages of PN diodes connected in series in opposite direction to each other, which are connected between the gate and the source of a MOS transistor. When a surge voltage due to ESD is applied between the gate and the source of the MOS transistor, avalanche breakdown occurs in the diodes, which then become conducting, and a surge current flows through the diodes. Consequently, because the electric energy of the surge current can be consumed in the diodes, the surge voltage is prevented from being applied to the gate oxide film of the MOS transistor, and the breakdown of the gate oxide film can be prevented. This technique of forming PN diodes in the polycrystalline silicon layer is widely used because of its high flexibility in the device manufacturing process.

However, according to the inventors' investigation, it has been found that such a structure cannot sufficiently achieve the effect of the protection diode. More specifically, in the PN diode formed in the polycrystalline silicon layer, the transport of electrons or holes is greatly inhibited by electron traps or hole traps existing at the crystal grain boundary. Consequently, the mobility of these carriers in polycrystalline silicon decreases to a fraction of the mobility in single-crystal silicon. Thus the so-called snapback effect does not occur, and current increases monotonically relative to voltage. That is, there is no case where the resistance abruptly decreases and results in an increased current when the voltage exceeds a certain value, but the current increases only with the increase of voltage. Thus the operating voltage of the protection diode increases. Hence the current transport capability decreases, and the energy of the surge current cannot be sufficiently consumed. Furthermore, the amount of heat generated in the polycrystalline silicon layer upon application of ESD reaches even several 10 to 100 W. However, an oxide film is formed directly below the polycrystalline silicon layer and has an extremely high thermal resistance. Hence this protection device cannot rapidly dissipate the generated heat and is susceptible to thermal breakdown. Thus, although the above technique for forming PN diodes in the polycrystalline silicon layer is effective in simplifying the manufacturing process, its protection effect is insufficient.

To avoid such problems, PN diodes can be formed in the single-crystal silicon constituting the substrate rather than in the polycrystalline silicon layer provided on the substrate. For example, in the technique disclosed in JP-A 7-122712(Kokai) (1995), an N-type epitaxial layer is formed on an N-type silicon substrate, a P-type layer is locally formed on the surface of the N-type epitaxial layer, and a plurality of N-type regions are locally formed inside the P-type layer. Thus an NPN structure can be formed in the single-crystal silicon substrate. This NPN structure is operable as a pair of Zener diodes connected in opposite direction to each other (i.e., an NPPN structure). Alternatively, it can be regarded as the operation of an NPN transistor with the base open.

When a surge voltage is applied to this NPN structure, the resistance decreases by the snapback effect, allowing a surge current to flow. Thus a device connected in parallel to this NPN structure, such as the gate oxide film of a MOS transistor, can be protected from ESD breakdown. Furthermore, because this NPN structure is formed in the substrate, the generated heat can be dissipated through the substrate, and the thermal breakdown is less likely to occur. Thus, by forming an NPN structure in the single-crystal silicon substrate, a protection device allowing a large current flow and also being resistant to heat can be realized. However, such a protection device occupies a certain area in the substrate surface and inhibits the downsizing of the semiconductor apparatus.

SUMMARY OF THE INVENTION

According to an aspect of the invention, there is provided a semiconductor apparatus including: a semiconductor substrate; an insulating film provided on the semiconductor substrate; and a semiconductor film provided on the insulating film, the semiconductor substrate including a region of a first current path including at least one diode, the semiconductor film including a region of a second current path including at least one diode, the first current path and the second current path being connected in parallel to each other, the region of the first current path including at least part of an area directly below the region of the second current path, and the first current path having a higher resistance than the second current path.

According to another aspect of the invention, there is provided A semiconductor apparatus including: a semiconductor substrate; an insulating film provided on the semiconductor substrate; a semiconductor film provided on the insulating film; a first region of a first conductivity type formed in the semiconductor substrate; a second region of a second conductivity type formed in the semiconductor substrate and being in contact with the first region; a third region of the first conductivity type formed in the semiconductor substrate; a first portion of the first conductivity type formed in the semiconductor film; a second portion of the second conductivity type formed in the semiconductor film and being in contact with the first portion; and a third portion of the first conductivity type formed in the semiconductor film, the first region being placed in a region including at least part of an area directly below the first portion and is connected to the first portion, the third region being placed in a region including at least part of an area directly below the third portion and is connected to the third portion, and a first current path extending from the first region through the second region to the third region having a higher resistance than a second current path extending from the first portion through the second portion to the third portion.

According to another aspect of the invention, there is provided A semiconductor apparatus including: a semiconductor substrate of a first conductivity type at least in an upper layer portion thereof; an insulating film provided on the semiconductor substrate; a semiconductor film provided on the insulating film; a first region of the first conductivity type formed in the upper layer portion; the first region including: a first high-concentration region; a second high-concentration region; a low-concentration region placed between the first high-concentration region and the second high-concentration region, and having a lower impurity concentration than the first high-concentration region and the second high-concentration region, a second region of a second conductivity type formed in the upper layer portion and being in contact with the second high-concentration region; a third region of the first conductivity type formed in the upper layer portion; a first portion of the first conductivity type formed in the upper portion layer and being connected to the first high-concentration region; a second portion of the second conductivity type formed in the upper layer portion and being contact with the first portion; a third portion of the first conductivity type formed in the upper layer portion and being connected to the third region; a body region of the second conductivity type formed in the upper layer portion; a source region of the first conductivity type formed in the body region; a first electrode connected to the first portion; a second electrode connected to the second high-concentration region; a third electrode connected to the third portion; a source electrode connected to the source region; a drain electrode formed on a lower surface of the semiconductor substrate; and a gate electrode placed in a region including a region directly above a portion placed between the source region, the first region being placed in a region including at least part of a region directly below the first portion, the third region being placed in a region including at least part of a region directly below the third portion, the gate electrode being connected to the second electrode, the source electrode being connected to the third electrode, and a first current path extending from the first region through the second region to the third region has a higher resistance than a second current path extending from the first portion through the second portion to the third portion.

DETAILED DESCRIPTION OF THE INVENTION

Embodiments of the invention will now be described with reference to the drawings, starting with a first embodiment of the invention.

Figure 1:
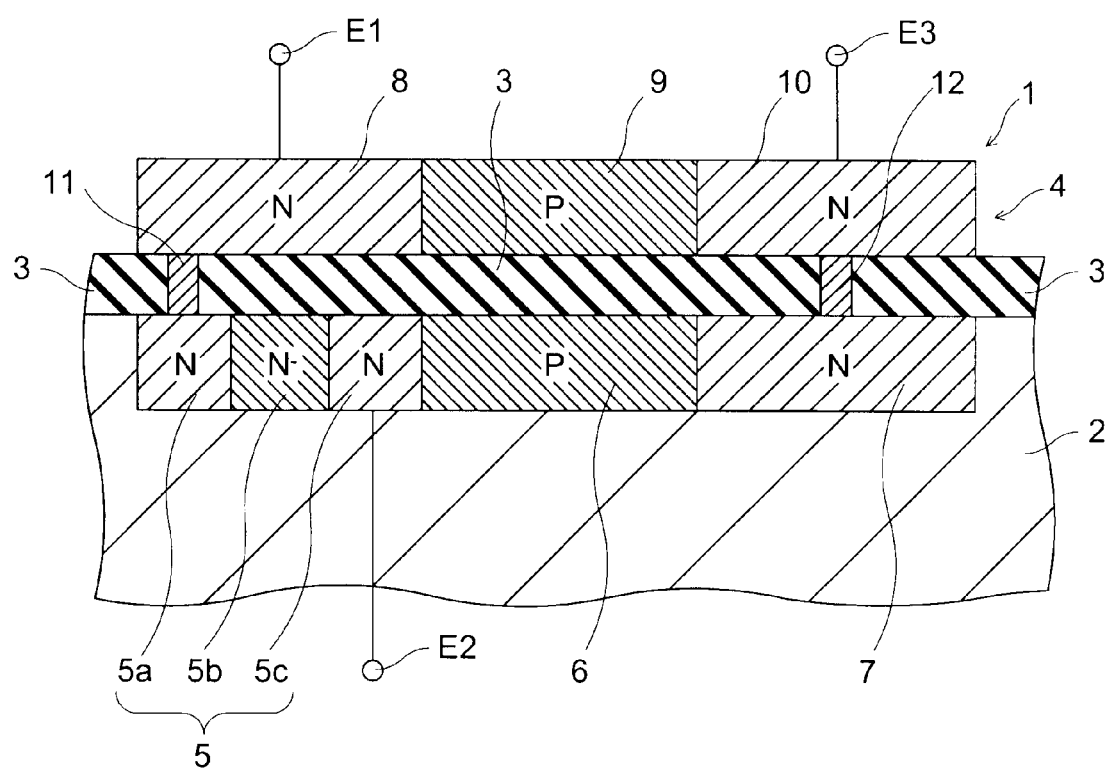
FIG. 1 is a cross-sectional view illustrating a semiconductor apparatus according to a first embodiment of the invention.

FIG. 1 is a cross-sectional view illustrating a semiconductor apparatus according to this embodiment.

Figure 2:
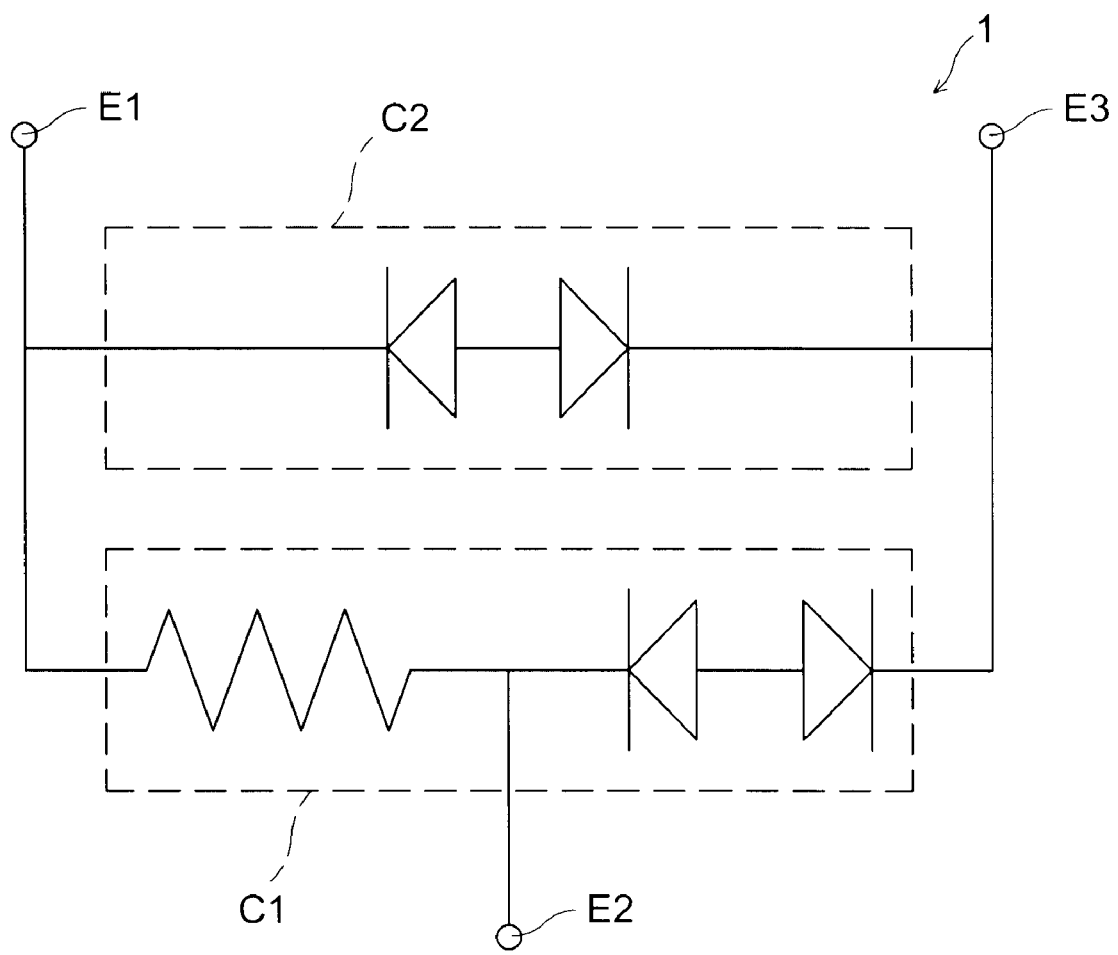
FIG. 2 is a circuit diagram illustrating the semiconductor apparatus according to the first embodiment.

FIG. 2 is a circuit diagram illustrating this semiconductor apparatus.

As shown in FIG. 1, the semiconductor apparatus 1 according to this embodiment includes a silicon substrate 2 of e.g. single-crystal silicon (Si). An insulating film 3 of e.g. silicon oxide ($SiO_2$) is provided on the silicon substrate 2, and a silicon film 4 of e.g. polycrystalline silicon is provided on the insulating film 3.

An N-type region 5, a P-type region 6, and an N-type region 7 are formed in an upper portion of the silicon substrate 2 and arrayed in this order. The P-type region 6 is in contact with both the N-type regions 5 and 7. On the other hand, an N-type portion 8, a P-type portion 9, and an N-type portion 10 are formed in the silicon film 4 and arrayed in this order. The P-type portion 9 is in contact with both the N-type portions 8 and 10. When the terms "N-type region" and "N-type portion" are used herein, the conductivity type of the region or portion is N-type. The same also applies to P-type.

The N-type region 5 is divided into three regions: an $N^+$-type region 5a, an $N^-$-type region 5b, and an $N^+$-type region 5c. The $N^+$-type region 5a, the $N^-$-type region 5b, and the $N^+$-type region 5c are arrayed in this order. The $N^-$-type region 5b is in contact with both the $N^+$-type region 5a and the $N^+$-type region 5c, and the $N^+$-type region 5c is in contact with the P-type region 6. The impurity concentration in the $N^-$-type region 5b is lower than the impurity concentration in the $N^+$-type region 5a and the impurity concentration in the $N^+$-type region 5c.

The $N^+$-type region 5a of the N-type region 5 is placed in a region including at least part of the directly underlying area of the N-type portion 8. A contact 11 is formed in a region of the insulating film 3 located between the $N^+$-type region 5a and the N-type portion 8, and connects the $N^+$-type region 5a to the N-type portion 8. The N-type region 7 is placed in a region including at least part of the directly underlying area of the N-type portion 10. A contact 12 is formed in a region of the insulating film 3 located between the N-type region 7 and the N-type portion 10, and connects the N-type region 7 to the N-type portion 10.

Furthermore, an electrode E1 is connected to the N-type portion 8, an electrode E2 is connected to the $N^+$-type region 5c, and an electrode E3 is connected to the N-type portion 10.

Thus PN diodes are formed at the interface between the $N^+$-type region 5c and the P-type region 6 and at the interface between the P-type region 6 and the N-type region 7, respectively. These PN diodes are connected in series in opposite direction to each other. Consequently, as shown in FIG. 2, a current path C1 extending from the N$^+$-type region 5a through the P-type region 6 to the N-type region 7 and including the two diodes is formed in the silicon substrate 2. Furthermore, the N-type region 5 includes the N$^-$-type region 5b, which serves as a resistor.

On the other hand, PN diodes are formed at the interface between the N-type portion 8 and the P-type portion 9 and at the interface between the P-type portion 9 and the N-type portion 10, respectively. These PN diodes are connected in series in opposite direction to each other. Consequently, a current path C2 extending from the N-type portion 8 through the P-type portion 9 to the N-type portion 10 and including the two diodes is formed in the silicon film 4.

The N$^+$-type region 5a of the N-type region 5 and the N-type portion 8 are connected to each other through the contact 11, and the N-type region 7 and the N-type portion 10 are connected to each other through the contact 12. Thus the current path C1 and the current path C2 are connected in parallel to each other. Because the N$^-$-type region 5b is interposed as a resistor in the current path C1, the current path C1 has a higher resistance than the current path C2. Thus the semiconductor apparatus 1 includes a n-circuit composed of reverse series-connected Zener diodes and a resistor. In this configuration, the N$^+$-type region 5a is placed in a region including at least part of the directly underlying area of the N-type portion 8, and the N-type region 7 is placed in a region including at least part of the directly underlying area of the N-type portion 10. Hence the region of the current path C1 in the silicon substrate 2 is a region including at least part of the directly underlying area of the region of the current path C2 in the silicon film 4. That is, as viewed from above, the region of the current path C1 and the region of the current path C2 overlap each other at least partially.

Next, the operation of the semiconductor apparatus according to this embodiment is described.

As shown in FIG. 2, in the semiconductor apparatus 1, the current paths C1 and C2 are connected in parallel to each other between the electrode E1 and the electrode E3, and a pair of diodes are connected in series in opposite direction to each other in each current path. Hence, if the voltage applied between the electrode E1 and the electrode E3 is less than a given value, no current flows between these electrodes in either direction.

However, if a voltage equal to or greater than the given value is applied between the electrode E1 and the electrode E3 by surge input or other causes, the reverse biased diode undergoes breakdown in the silicon substrate 2 and the silicon film 4, and a current flows through the current paths C1 and C2, thereby consuming the surge power. Thus the circuit composed of the current paths C1 and C2 can be used as an ESD protection device.

Next, the effect of this embodiment is described.

The semiconductor apparatus 1 according to this embodiment includes two current paths C1 and C2, which are connected in parallel to each other. Hence, as compared with the case of only one current path, a larger current can be passed. Furthermore, because the current path C1 is placed directly below the current path C2, the device area can be used efficiently. Moreover, because the current path C1 has a higher resistance than the current path C2, more heat may be generated in the current path C1. However, even in this case, because the current path C1 is formed in the silicon substrate 2, the heat generated in the current path C1 is easily dissipated through the silicon substrate 2. Hence the semiconductor apparatus 1 is superior in heat resistance. Thus this embodiment can provide a semiconductor apparatus including a protection device with high area efficiency and protection performance.

This embodiment has been described with reference to the example where the current paths C1 and C2 each include a pair of PN diodes. However, this embodiment is not limited thereto, but three or more PN diodes may be provided in at least one of the current paths. For example, one or more pairs of N-type and P-type portions may be provided between the P-type portion 9 and the N-type portion 10. Furthermore, in the case where the direction of voltage applied in normal operation is fixed, it is also possible to provide only one PN diode in each current path. Moreover, the conductivity types of the regions and portions in the above description may be reversed.

Next, a second embodiment of the invention is described.

Figure 3:
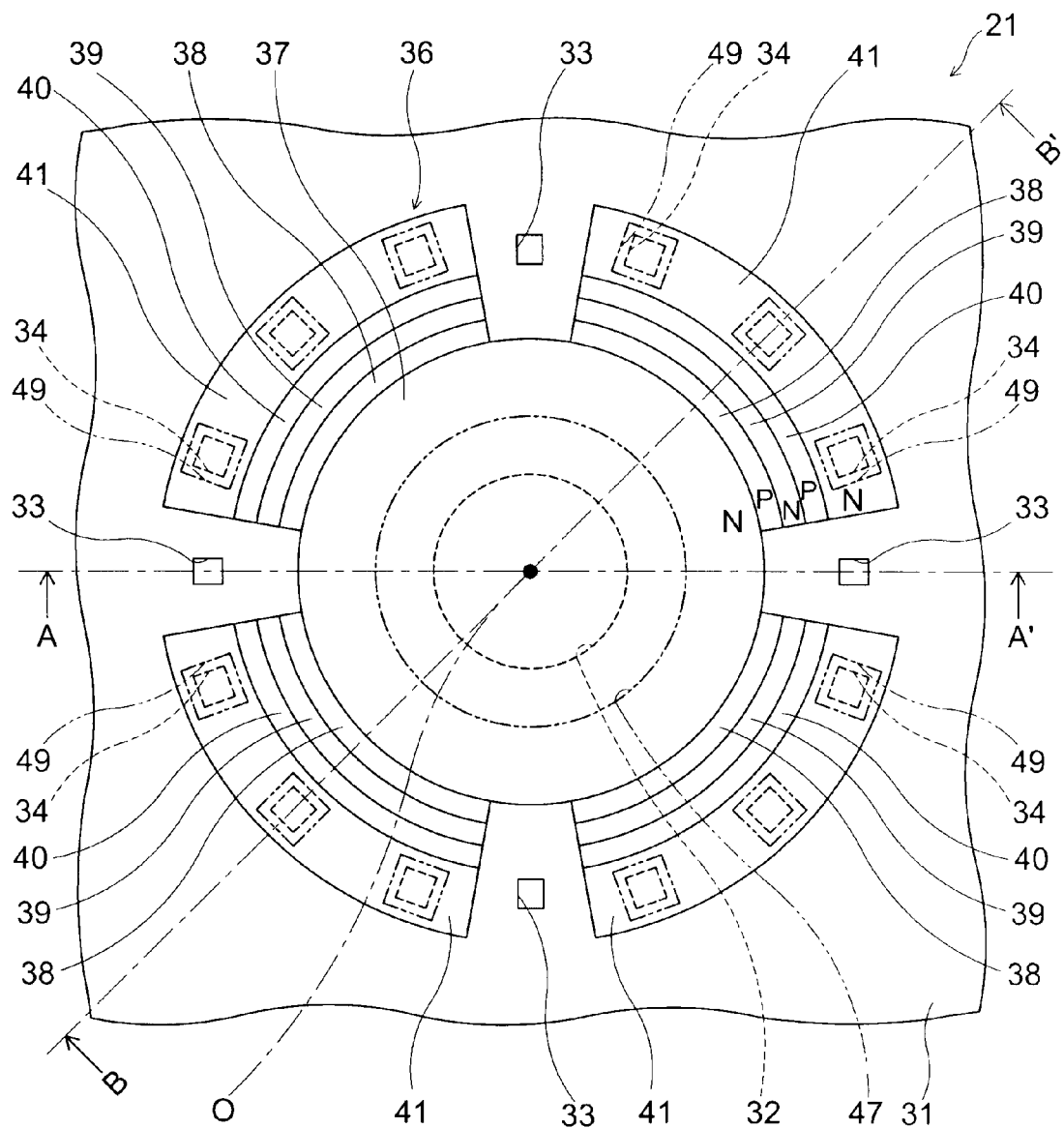
FIG. 3 is a plan view illustrating a semiconductor apparatus according to the second embodiment of the invention, which shows the upper surface of the polycrystalline silicon film.

FIG. 3 is a plan view illustrating a semiconductor apparatus according to this embodiment, which shows the upper surface of the polycrystalline silicon film.

Figure 4:
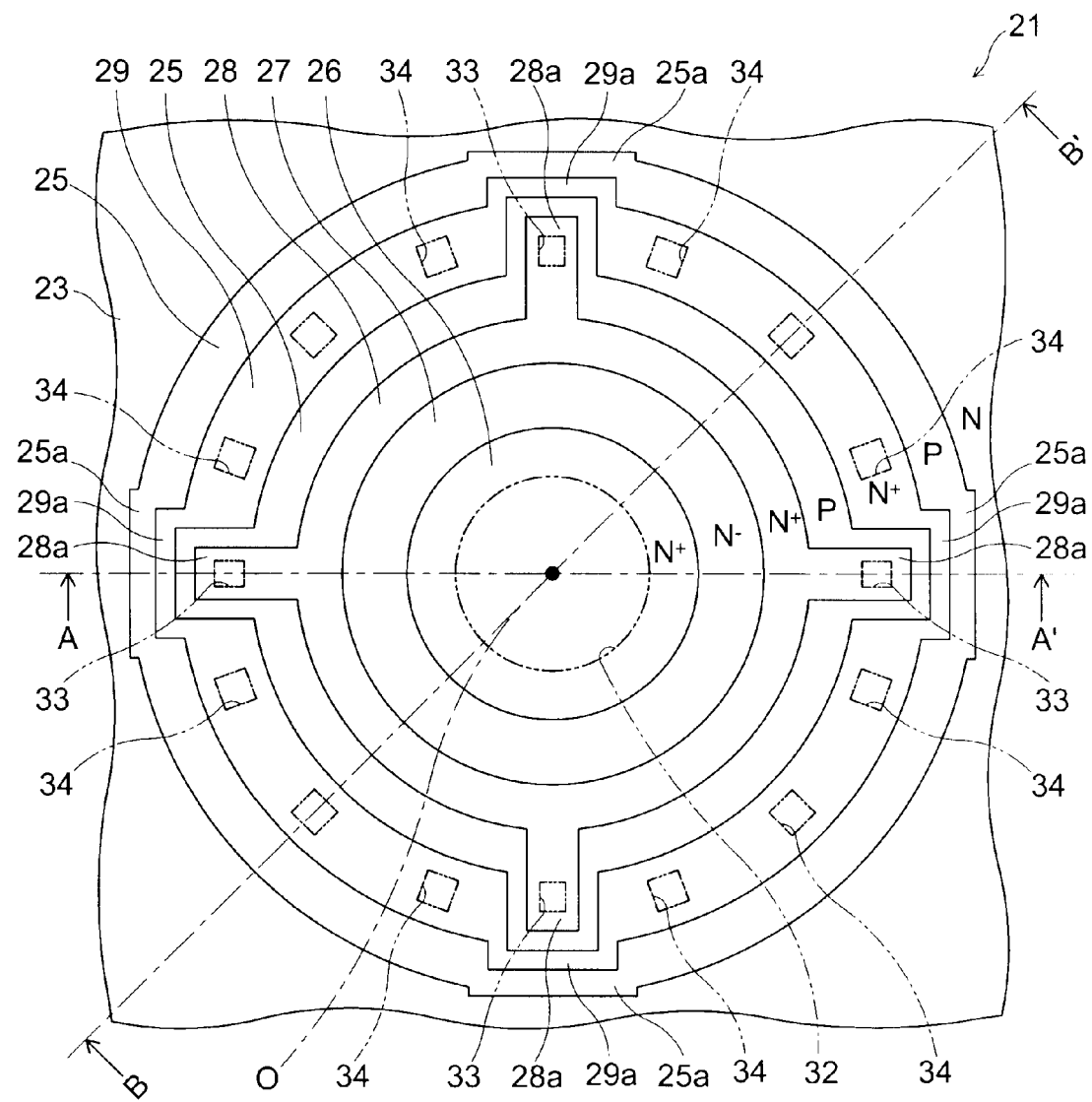
FIG. 4 is a plan view illustrating the semiconductor apparatus according to the second embodiment, which shows the upper surface of the silicon substrate.

FIG. 4 is a plan view illustrating the semiconductor apparatus according to this embodiment, which shows the upper surface of the silicon substrate.

Figure 5:
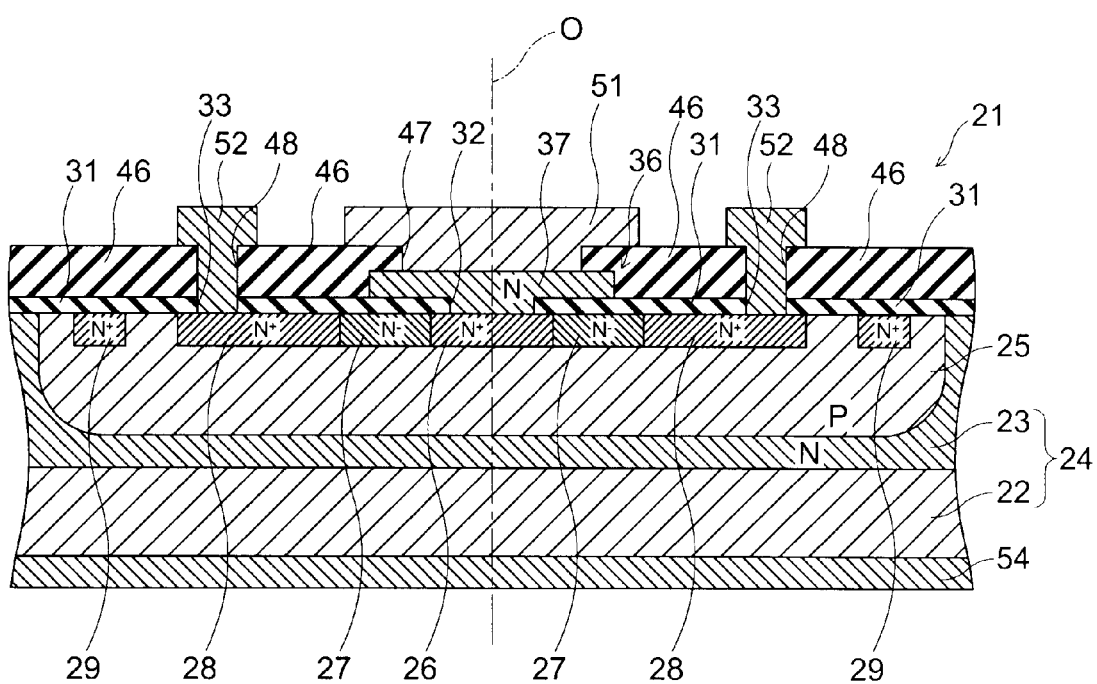
FIG. 5 is a cross-sectional view taken along line A-A' shown in FIGS. 3 and 4.

FIG. 5 is a cross-sectional view taken along line A-A' shown in FIGS. 3 and 4.

Figure 6:
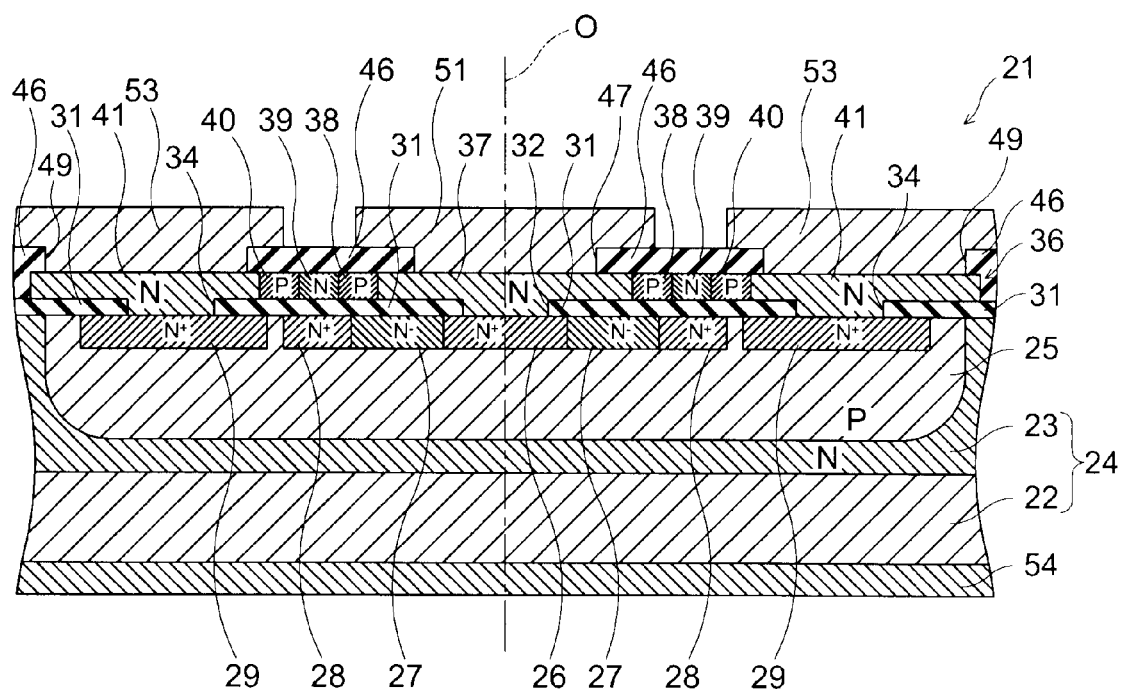
FIG. 6 is a cross-sectional view taken along line B-B' shown in FIGS. 3 and 4.

FIG. 6 is a cross-sectional view taken along line B-B' shown in FIGS. 3 and 4.

Figure 7:
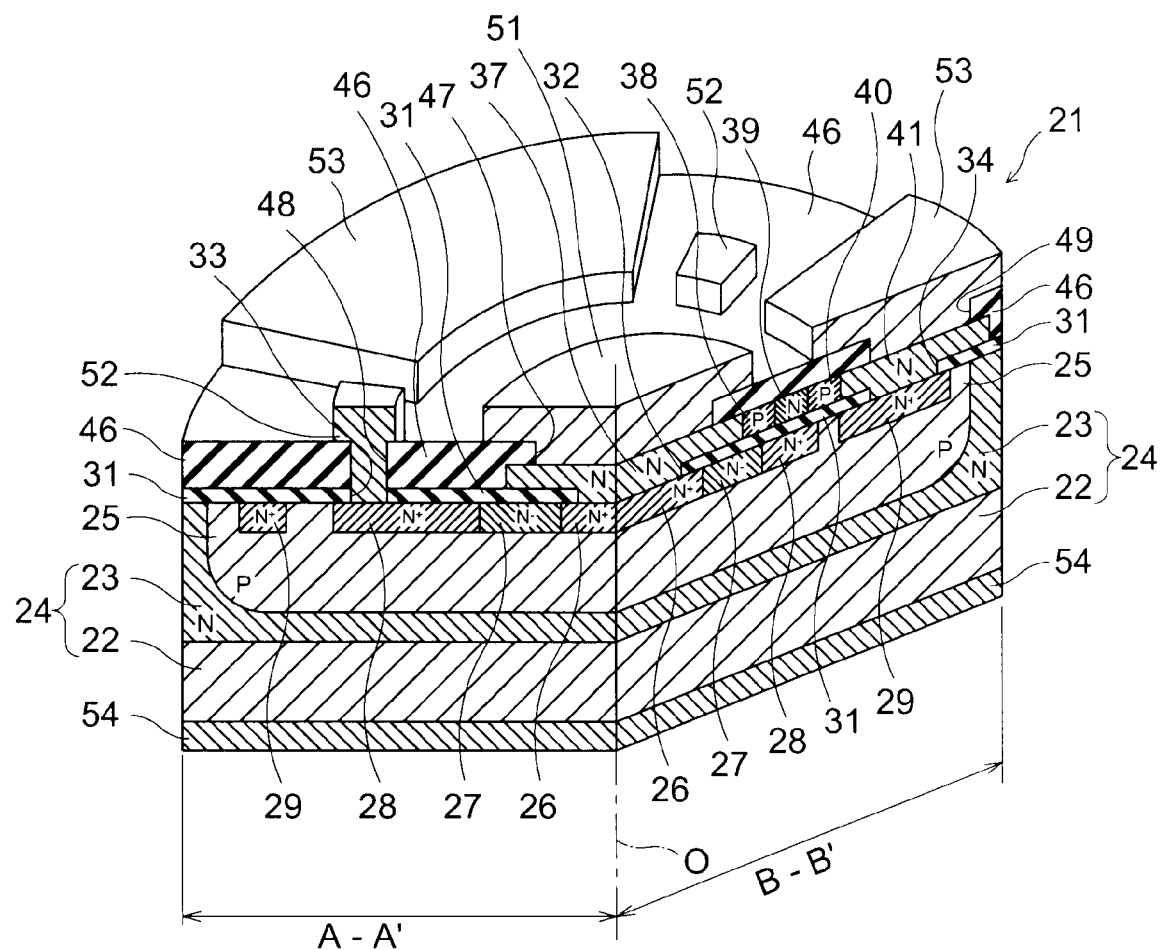
FIG. 7 is a perspective cross-sectional view illustrating the semiconductor apparatus according to the second embodiment.

FIG. 7 is a perspective cross-sectional view illustrating this semiconductor apparatus.

Figure 8:
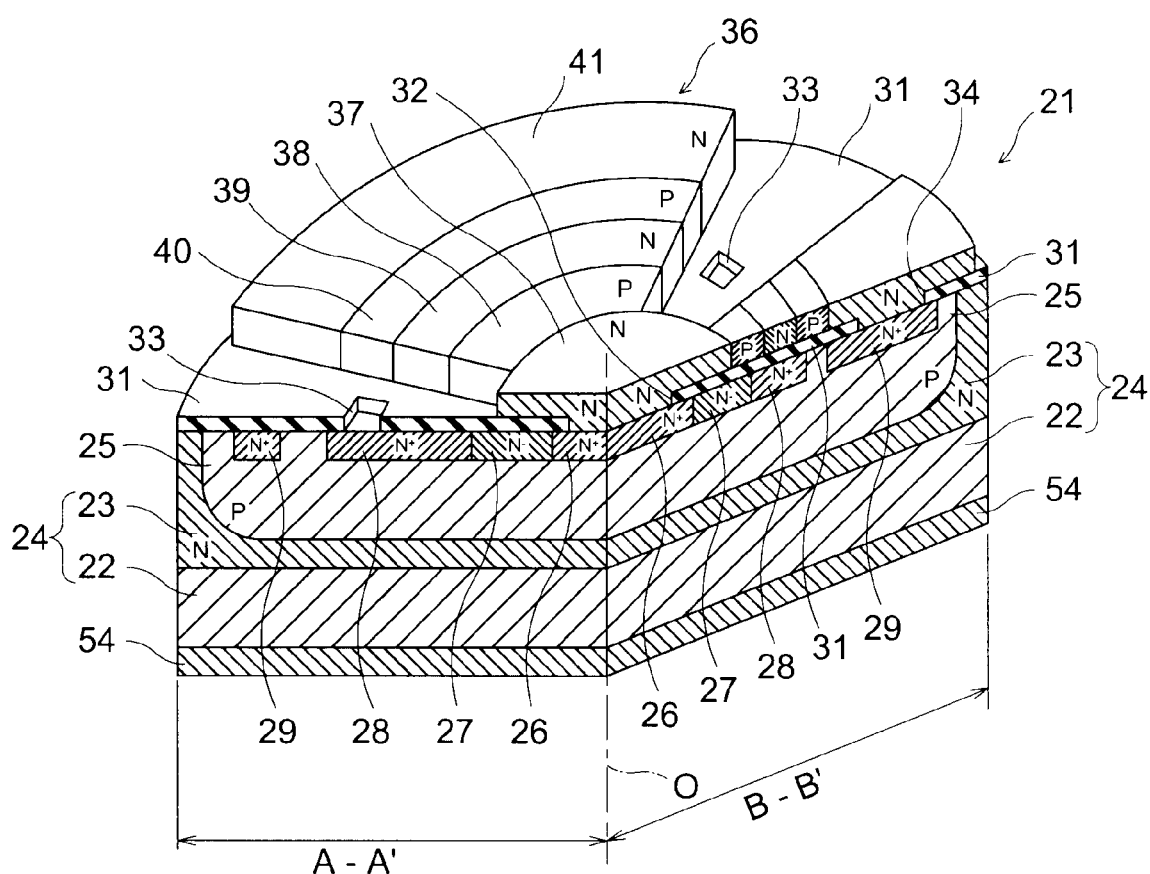
FIG. 8 is a perspective cross-sectional view illustrating the semiconductor apparatus according to the second embodiment, which shows the upper surface of the polycrystalline silicon film.

FIG. 8 is a perspective cross-sectional view illustrating this semiconductor apparatus, which shows the upper surface of the polycrystalline silicon film.

Figure 9:
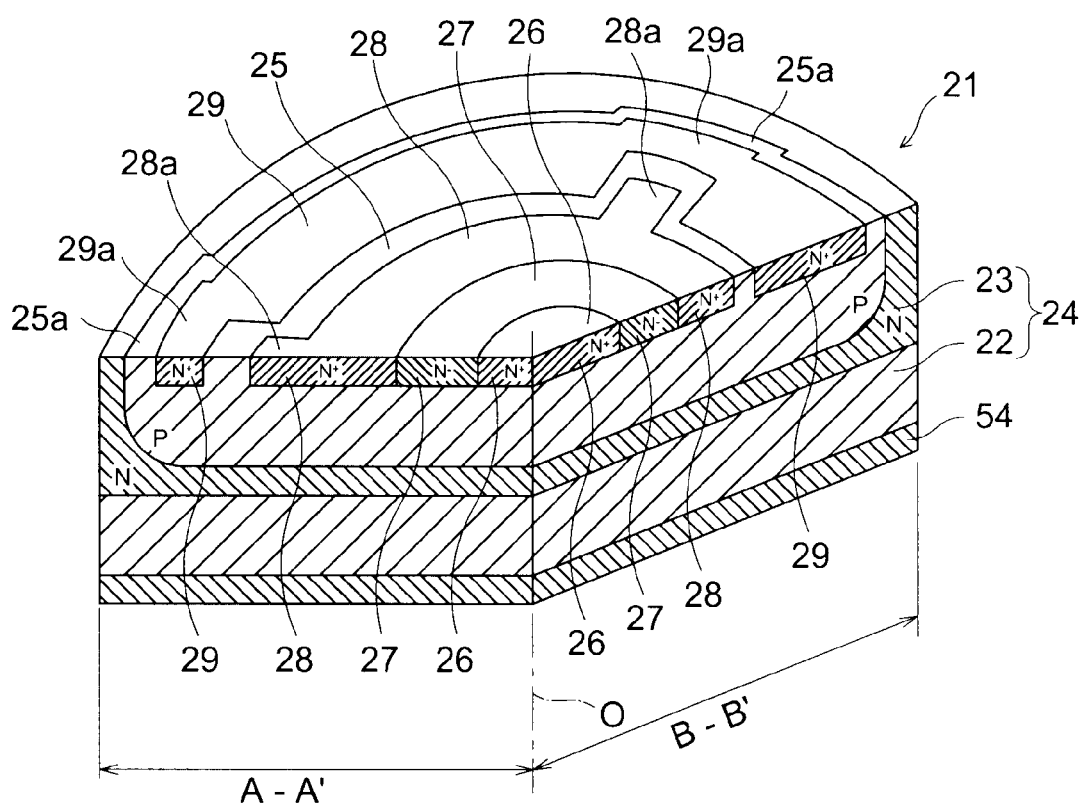
FIG. 9 is a perspective cross-sectional view illustrating the semiconductor apparatus according to the second embodiment, which shows the upper surface of the silicon substrate.

FIG. 9 is a perspective cross-sectional view illustrating this semiconductor apparatus, which shows the upper surface of the silicon substrate.

In the perspective cross-sectional views shown in FIGS. 7 to 9, the left side of each figure shows the A-A' cross section shown in FIG. 5, and the right side of each figure shows the B-B' cross section shown in FIG. 6. FIG. 8 is a figure in which the electrodes 51 to 53 and the silicon oxide film 46 described below are omitted from FIG. 7. FIG. 9 is a figure in which the polycrystalline silicon film 36 and the silicon oxide film 31 described below are omitted from FIG. 8.

A description will now be given with reference to FIGS. 3 to 9. As shown particularly in FIG. 5, the semiconductor apparatus 21 according to this embodiment includes a substrate 22 of single-crystal silicon, and an N-type silicon layer 23 is formed by epitaxial growth on the upper surface of the substrate 22. In the following, the substrate 22 and the N-type silicon layer 23 are collectively referred to as a silicon substrate 24.

As shown particularly in FIGS. 4 and 5, a P-type region 25 is formed in part of the upper surface of the N-type silicon layer 23. As viewed in the direction perpendicular to the upper surface of the N-type silicon layer 23 (hereinafter referred to as "in plan view"), the P-type region 25 has a generally circular shape. However, at each of the positions on the outer periphery of the P-type region 25 with four-fold symmetry about the central axis O of the P-type region 25, a rectangular extension 25a extending in the direction away from the central axis O (hereinafter referred to as "outward direction") is formed. The P-type region 25 has an impurity concentration of e.g. $1\times10^{17}$ to $5\times10^{18}$ cm$^{-3}$.

In the upper surface of the P-type region 25, an N$^+$-type region 26, an N$^-$-type region 27, an N$^+$-type region 28, and an N$^+$-type region 29 are formed concentrically in this order toward the outward direction. The N$^+$-type region 26 has an impurity concentration of e.g. $1\times10^{19}$ cm$^{-3}$ or more. The impurity concentration in the N⁻-type region 27 is lower than the impurity concentration in the N⁺-type regions 26, 28, and 29. In plan view, the N⁺-type region 26 has a circular shape about the central axis O of the P-type region 25, the N⁻-type region 27 has an annular shape about the central axis O, and the N⁺-type region 28 and the N⁺-type region 29 have a generally annular shape. At the position corresponding to the extension 25a in the N⁺-type region 28 and the N⁺-type region 29, extensions 28a and 29a extending toward the outward direction are formed, respectively.

The N⁺-type region 26 is in contact with the N⁻-type region 27, and the N⁻-type region 27 is in contact with the N⁺-type region 28. However, the N⁺-type region 28 is spaced from the N⁺-type region 29, and the P-type region 25 is interposed therebetween. The portion of the P-type region 25 interposed between the N⁺-type region 28 and the N⁺-type region 29 has a generally annular shape in plan view.

A silicon oxide film 31 is provided on the N-type silicon layer 23. A circular opening 32 is formed in the silicon oxide film 31 directly above the N⁺-type region 26. The central axis of the opening 32 coincides with the central axis O of the P-type region 25, and the opening 32 is placed inside the N⁺-type region 26 in plan view. Furthermore, an opening 33 illustratively having a rectangular shape is formed in the silicon oxide film 31 directly above the extension 28a of the N⁺-type region 28. Moreover, in the silicon oxide film 31 directly above the N⁺-type region 29, a plurality of openings 34 are formed along the circumferential direction of the N⁺-type region 29. For example, the openings 34 are formed at three positions between each pair of extensions 29a, i.e., at twelve positions in total, and illustratively have a rectangular shape.

As shown particularly in FIGS. 3 and 6, a polycrystalline silicon film 36 made of polycrystalline silicon is provided on the silicon oxide film 31. In the polycrystalline silicon film 36, an N-type portion 37, a P-type portion 38, an N-type portion 39, a P-type portion 40, and an N-type portion 41 are formed concentrically in this order toward the outward direction. Each portion is in contact with the portion placed next thereto. In plan view, the N-type portion 37 has a circular shape about the central axis O, and the opening 32 and the N⁺-type region 26 are placed inside the N-type portion 37. Thus the N-type portion 37 is connected to the N⁺-type region 26 through the opening 32.

In plan view, the P-type portion 38, the N-type portion 39, the P-type portion 40, and the N-type portion 41 constitute four trapezoidal sectors formed by dividing an annulus about the central axis O into four portions along the circumferential direction. The P-type portion 38, the N-type portion 39, the P-type portion 40, and the N-type portion 41 placed in each trapezoidal sector have an arc shape formed by dividing an annulus about the central axis O into four portions. Thus the P-type portion 38, the N-type portion 39, the P-type portion 40, and the N-type portion 41 are not placed directly above the extensions 28a, that is, directly above the openings 33. The width of the N-type portion 41, that is, its length along the outward direction, is wider than the width of the P-type portion 38, the N-type portion 39, and the P-type portion 40. Thus the N-type portion 41 is located directly above the openings 34, and connected to the N⁺-type region 29 through the openings 34.

As shown particularly in FIG. 5, a silicon oxide film 46 is provided on the silicon oxide film 31 so as to cover the polycrystalline silicon film 36. The region of the lower surface of the silicon oxide film 46 corresponding to the area directly above the polycrystalline silicon film 36 is in contact with the upper surface of the polycrystalline silicon film 36, and the remaining region is in contact with the upper surface of the silicon oxide film 31. As shown particularly in FIG. 3, a circular opening 47 is formed in the silicon oxide film 46 directly above the N-type portion 37. The central axis of the opening 47 coincides with the central axis O, and the opening 47 is placed inside the N-type portion 37 in plan view. Furthermore, an opening 48 is formed in the silicon oxide film 46 directly above the opening 33 and is in communication with the opening 33. Moreover, in the silicon oxide film 46 located directly above the N-type portion 41, a plurality of openings 49 are formed along the circumferential direction of the N-type portion 41. For example, the openings 49 are formed at three positions in each arc-shaped portion of the N-type portion 41, i.e., at twelve positions in total, and illustratively have a rectangular shape. For example, in plan view, the opening 34 of the silicon oxide film 31 is placed inside the opening 49 of the silicon oxide film 46.

As shown particularly in FIGS. 5 and 7, three types of electrodes 51 to 53 are provided on the silicon oxide film 46. There is one electrode 51, placed on the central axis O. In plan view, the electrode 51 has a circular shape about the central axis O, and is placed in a region including the directly overlying area of the opening 47. Thus the electrode 51 is connected to the N-type portion 37 through the opening 47.

The number of electrodes 52 and 53 is four, respectively, and they are placed at positions with four-fold symmetry about the central axis O. Here, the electrodes 52 and the electrodes 53 are alternately arrayed and spaced from each other along the circumferential direction of an imaginary circle about the central axis O. In plan view, the electrode 52 has a generally rectangular shape, for example, and is placed in a region including the directly overlying area of the openings 33 and 48. Thus the electrode 52 is connected to the N⁺-type region 28 through the openings 48 and 33. On the other hand, the electrode 53 is shaped like a trapezoidal sector, for example, and placed in a region including the directly overlying area of the openings 49. Thus the electrode 53 is connected to the N-type portion 41 through the openings 49. On the other hand, an electrode 54 connected to the substrate 22 is provided on the lower surface of the substrate 22.

By the above configuration, the following circuit is formed in the semiconductor apparatus 21. The electrode 51 is connected to the N-type portion 37 through the opening 47, and the N-type portion 37 is connected to the N⁺-type region 26 through the opening 32. The electrode 53 is connected to the N-type portion 41 through the openings 49, and the N-type portion 41 is connected to the N⁺-type region 29 through the openings 34. Thus a current path passing through the silicon substrate 24 (hereinafter also referred to as "lower current path") and a current path passing through the polycrystalline silicon film 36 (hereinafter also referred to as "upper current path") are formed in parallel to each other between the electrode 51 and the electrode 53.

The lower current path is formed from series connection of the N⁺-type region 26, the N⁻-type region 27, the N⁺-type region 28, the P-type region 25, and the N⁺-type region 29. Among them, the N⁻-type region 27 serves as a resistor in the lower current path. The N⁺-type region 28 and the P-type region 25 constitute a PN diode, and the P-type region 25 and the N⁺-type region 29 also constitute another PN diode. Hence, in the lower current path, a resistor is series connected to an NPN structure composed of a pair of PN diodes connected in opposite direction to each other.

On the other hand, the upper current path is formed from series connection of the N-type portion 37, the P-type portion 38, the N-type portion 39, the P-type portion 40, and the N-type portion 41. Thus the upper current path has an NPNPN structure, that is, four PN diodes are connected in series so that forward diodes and reverse diodes are alternately arrayed. Because the lower current path includes the N⁻-type region 27, the lower current path has a higher resistance than the upper current path.

The electrode 52 is connected to the N⁺-type region 28 through the openings 48 and 33. Thus the electrode 52 is connected between the resistor (N⁻-type region 27) and the NPN structure (the N⁺-type region 28, the P-type region 25, and the N⁺-type region 29) in the lower current path. This results in a circuit equivalent to the circuit shown in FIG. 2, that is, a n-circuit composed of reverse series-connected Zener diodes and a resistor.

Next, a method for manufacturing a semiconductor apparatus 21 according to this embodiment is described. The shapes, positional relationships, and electrical connections of the components are as described above, and hence the detailed description thereof is omitted.

First, an N-type silicon layer 23 is epitaxially grown on a substrate 22 to fabricate a silicon substrate 24. Next, an impurity serving as an acceptor is introduced from the upper side of the silicon substrate 24 by ion implantation or diffusion to form a P-type region 25 in part of the upper surface of the N-type silicon layer 23.

Next, a silicon oxide film 31 is formed on the entire surface of the N-type silicon layer 23. Then the silicon oxide film 31 is partially removed to form openings 32, 33, and 34 in the silicon oxide film 31. Next, an impurity serving as a donor is introduced into a circular region about the central axis O of the P-type region 25 by ion implantation or diffusion to form an N⁺-type region 26. Then a similar process is used to form an N⁻-type region 27, an N⁺-type region 28, and an N⁺-type region 29 concentrically in this order toward the outward direction.

Next, polycrystalline silicon is selectively deposited on the silicon oxide film 31 to selectively form a polycrystalline silicon film 36. Then an impurity is selectively introduced into the polycrystalline silicon film 36 by ion implantation or diffusion to form an N-type portion 37, a P-type portion 38, an N-type portion 39, a P-type portion 40, and an N-type portion 41 concentrically in this order toward the outward direction. At this time, the N-type portion 37 is formed also in the opening 32 and connected to the N⁺-type region 26. Furthermore, the N-type portion 41 is formed also in the openings 34 and connected to the N⁺-type region 29.

Next, a silicon oxide film 46 is formed on the entire surface of the silicon oxide film 31 so as to cover the polycrystalline silicon film 36. Then the silicon oxide film 46 is selectively removed to form openings 47, 48, and 49. At this time, the opening 47 is formed in a circular region directly above the N-type portion 37, the opening 48 is formed directly above the opening 33, and the opening 49 is formed in part of the directly overlying area of the N-type portion 41.

Next, one electrode 51, four electrodes 52, and four electrodes 53 are formed with spacing from each other on the silicon oxide film 46. At this time, the electrode 51 is formed so as to cover the opening 47, the electrode 52 is formed so as to cover the opening 48, and the electrode 53 is formed so as to cover the opening 49. On the other hand, an electrode 54 is formed on the lower surface of the substrate 22. Thus the electrode 51 is connected to the N-type portion 37 through the opening 47, and further connected to the N⁺-type region 26 through the N-type portion 37. The electrode 52 is connected to the N⁺-type region 28 through the openings 48 and 33. Furthermore, the electrode 53 is connected to the N-type portion 41 through the openings 49, and further connected to the N⁺-type region 29 through the N-type portion 41. Moreover, the electrode 54 is connected to the substrate 22. The semiconductor apparatus 21 is thus manufactured.

Next, the operation of the semiconductor apparatus according to this embodiment is described.

As described above, in the semiconductor apparatus 21, the lower current path and the upper current path are connected in parallel to each other between the electrode 51 and the electrode 53, and a plurality of diodes are connected in series in opposite direction to each other in each current path. Hence, even if a voltage is applied between the electrode 51 and the electrode 53, no current flows between these electrodes in either direction as long as the applied voltage is less than a given value, because a reverse connected diode is necessarily interposed in each current path.

However, if a surge is applied between the electrode 51 and the electrode 53 and a voltage equal to or greater than the given value is applied therebetween, then the reverse connected diode undergoes breakdown in each current path, and a current flows through each current path, thereby consuming the surge power. Thus the circuit formed in the semiconductor apparatus 21 can be used as an ESD protection device.

Next, the effect of this embodiment is described.

The semiconductor apparatus 21 according to this embodiment includes two current paths connected in parallel to each other. Hence, as compared with the case of only one current path, a larger current can be passed. Here, because the lower current path is formed in single-crystal silicon, it has high carrier mobility, and a particularly large current flows therethrough. Furthermore, the P-type region 25 and the N-type regions formed therein constituting the lower current path are placed directly below the polycrystalline silicon film 36 constituting the upper current path. Hence the device area can be used efficiently. Thus, in this embodiment, the lower current path made of a single-crystal silicon bulk and the upper current path made of a polycrystalline silicon film are three-dimensionally configured. Hence it is possible to retain a large ESD capability while keeping a small device area.

Furthermore, in the semiconductor apparatus 21, because the lower current path has a higher resistance than the upper current path, more heat may be generated in the lower current path. However, even in this case, because the lower current path is formed in the silicon substrate 24, the heat generated in the lower current path is easily dissipated through the silicon substrate 24. Hence the semiconductor apparatus 21 is superior in heat resistance.

Moreover, in this embodiment, in plan view, the lower current path and the upper current path are placed in a circular region. In a typical semiconductor apparatus, the pad to which an external interconnect is bonded is often formed in a circular shape. Hence, by forming these current paths in a circular region, the ESD protection device composed of these current paths can be placed directly below the pad. Thus the device area can be used more efficiently to further downsize the semiconductor apparatus.

Furthermore, the electrode 51 is placed at the center of the circular region in which the lower current path and the upper current path are formed, and the electrodes 53 are placed at a plurality of positions at the periphery. Thus the surge current can be passed uniformly. This can increase the maximum amount of surge current per unit area, further enhancing the area efficiency. Moreover, the electrodes 53 are placed at positions with rotational symmetry about the central axis O, and thereby the surge current can be made uniform more effectively. Thus this embodiment can provide a semiconductor apparatus including a protection device with high area efficiency and protection performance.

In this embodiment, the electrodes 53 are illustratively placed at positions with four-fold symmetry about the central axis O. However, this embodiment is not limited thereto, but the electrodes 53 may be placed at positions with n-fold symmetry about the central axis O, where n is an integer of two or more. The same also applies to the electrodes 52.

Next, a third embodiment of the invention is described.

This embodiment is based on a semiconductor apparatus including a vertical N-channel MOS transistor, where the ESD protection device according to the above second embodiment is formed in the same silicon substrate as the MOS transistor and is connected thereto to serve as a protection device for the MOS transistor.

Figure 10:
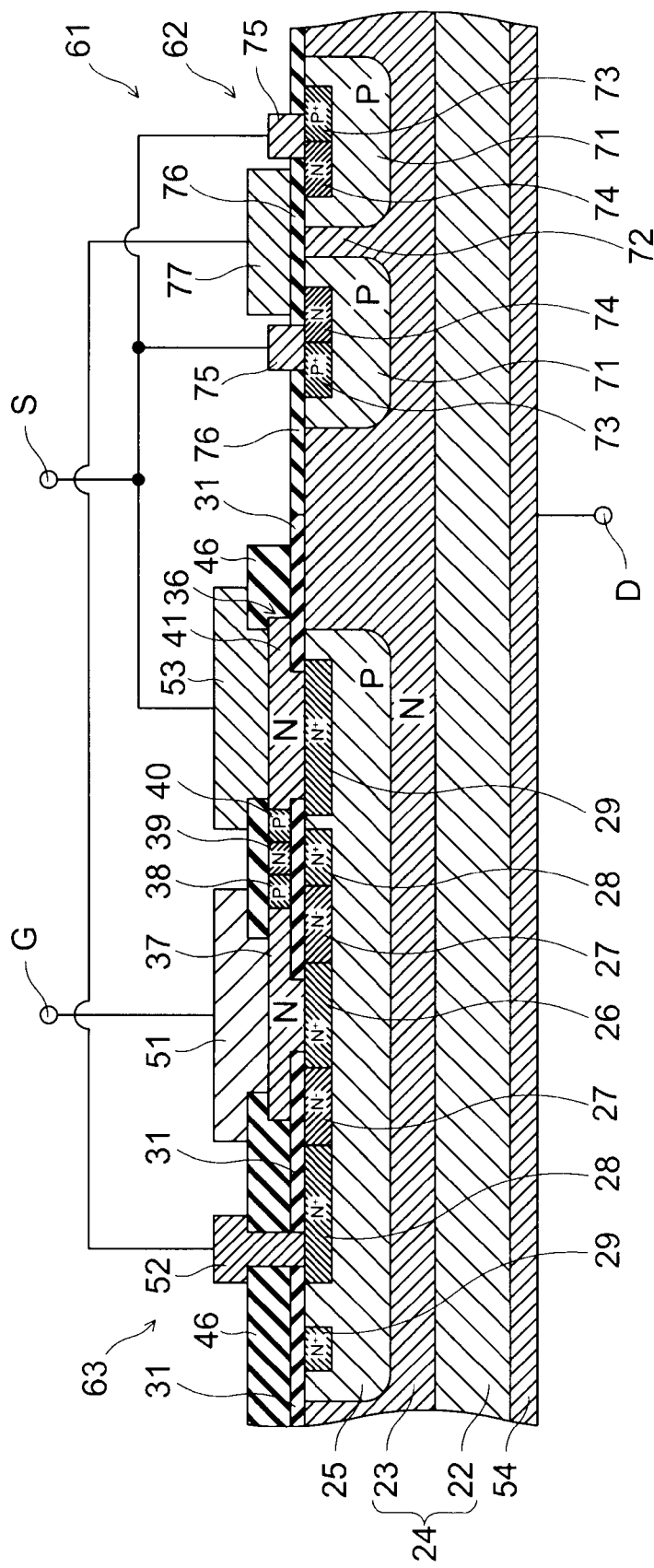
FIG. 10 is a schematic cross-sectional view illustrating a semiconductor apparatus according to a third embodiment of the invention.

FIG. 10 is a schematic cross-sectional view illustrating a semiconductor apparatus according to this embodiment.

Figure 11:
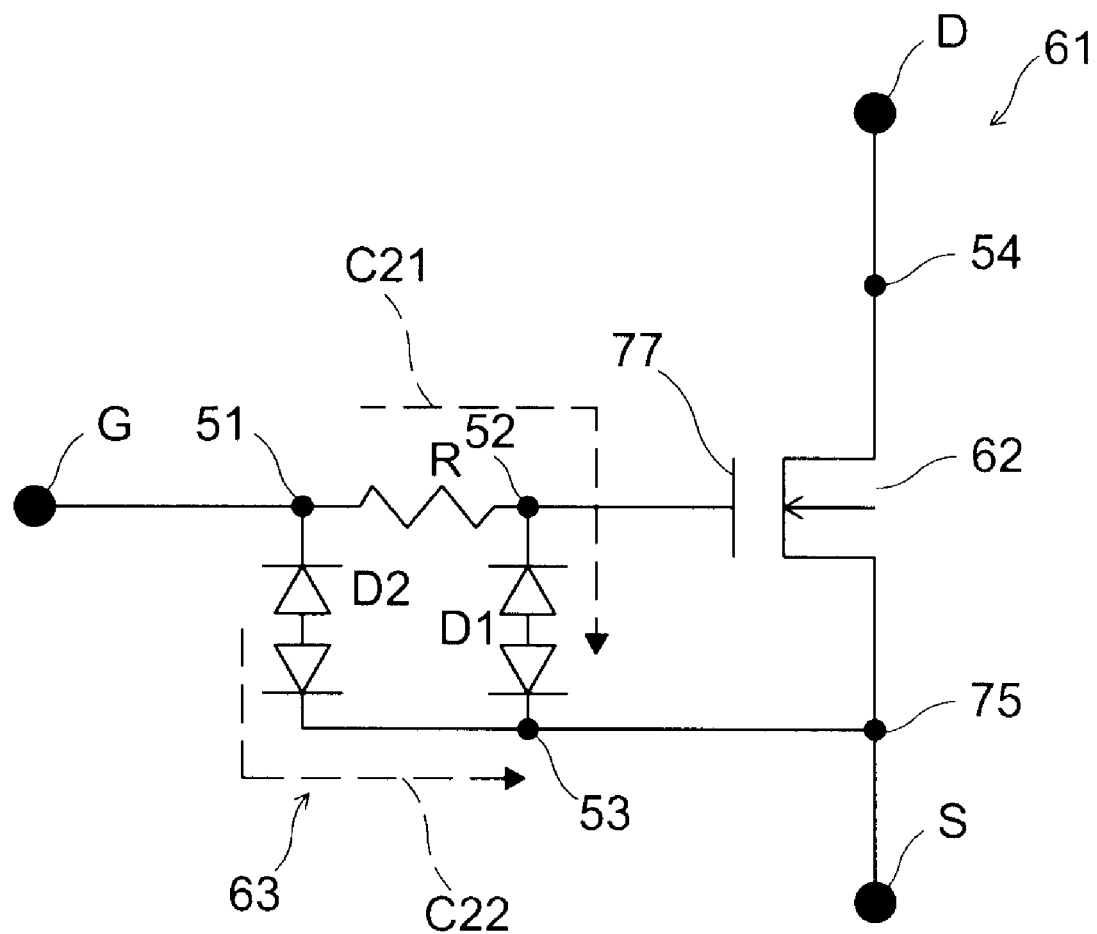
FIG. 11 is a circuit diagram illustrating the semiconductor apparatus according to the third embodiment.

FIG. 11 is a circuit diagram illustrating this semiconductor apparatus.

In the portion of FIG. 10 showing the ESD protection device, the above-described A-A' cross section shown in FIG. 5 and the B-B' cross section shown in FIG. 6 are schematically shown in a developed view.

As shown in FIG. 10, in the semiconductor apparatus 61 according to this embodiment, a vertical N-channel MOS transistor 62 and an ESD protection device 63 are formed in a silicon substrate 24. The configuration of the ESD protection device 63 is the same as that of the ESD protection device according to the above second embodiment.

In the vertical N-channel MOS transistor 62, a plurality of P-type body regions 71 are selectively formed in the upper surface of an N-type silicon layer 23, and the region of the N-type silicon layer 23 located between adjacent P-type body regions 71 constitutes a mesa 72. A P-type body contact region 73 and an N-type source region 74 are formed adjacent to each other in the upper surface of each P-type body region 71. Furthermore, a source electrode 75 is formed on the N-type silicon layer 23 directly above each P-type body region 71. The source electrode 75 is connected to the P-type body contact region 73 and the N-type source region 74. Moreover, a gate oxide film 76 is formed on the N-type silicon layer 23 outside the source electrode 75, and a gate electrode 77 of polycrystalline silicon is provided on the gate oxide film 76. The gate electrode 77 is placed in a region including the area directly above the portion of the P-type body region 71 located between the N-type source region 74 and the mesa 72. An electrode 54 is formed on the lower surface of the silicon substrate 24 and serves as a drain electrode of the MOS transistor 62.

The source electrode 75 of the MOS transistor 62 is connected to the electrode 53 of the ESD protection device 63 and a source terminal S by an interconnect formed in an upper interconnect layer (not shown) of the semiconductor apparatus 61. The electrode 54 serving as the drain electrode of the MOS transistor 62 is connected to a drain terminal D. Furthermore, the gate electrode 77 of the MOS transistor 62 is connected to the electrode 52 of the ESD protection device 63. Moreover, the electrode 51 of the ESD protection device 63 is connected to a gate terminal G.

The semiconductor apparatus 61 thus configured has a current path, between the gate terminal G and the gate electrode 77, in which the electrode 51, the N-type portion 37, the N⁺-type region 26, the N⁻-type region 27, the N⁺-type region 28, and the electrode 52 are connected in this order. Between the gate terminal G and the source terminal S, the above-described lower current path and upper current path are connected in parallel to each other. Here, the resistive component derived from the N⁻-type region 27 is represented by a resistor R, the structure composed of two diodes connected in opposite direction to each other formed from the N⁺-type region 28, the P-type region 25, and the N⁺-type region 29 is represented by a diode D1, and the structure composed of four diodes connected alternately in opposite direction to each other formed from the N-type portion 37, the P-type portion 38, the N-type portion 39, the P-type portion 40, and the N-type portion 41 is represented by a diode D2. Then the semiconductor apparatus 61 has an equivalent circuit as shown in FIG. 11. More specifically, the resistor R is interposed between the gate terminal G and the gate electrode 77, and the lower current path C21 and the upper current path C22 are interposed in parallel between the gate terminal G and the source terminal S. The lower current path C21 is formed from series connection of the resistor R and the diode D1, and the upper current path C22 is formed from the diode D2.

Next, the operation of this embodiment is described.

When an ESD power is applied between the gate terminal G and the source terminal S of the semiconductor apparatus 61, the ESD power is split into the lower current path C21 and the upper current path C22 and flows toward the source terminal S. This prevents a high voltage from being applied between the source electrode 75 and the gate electrode 77 of the MOS transistor 62, and the breakdown of the gate oxide film 76 can be prevented. The operation of this embodiment other than the foregoing is the same as that of the above second embodiment.

Next, the effect of this embodiment is described.

In this embodiment, a vertical N-channel MOS transistor 62 and an ESD protection device 63 are formed in a common silicon substrate 24. Thus these devices can be formed in a common process. Furthermore, the ESD protection device 63 can be placed near the vertical N-channel MOS transistor 62. Hence the interconnect resistance between these devices can be decreased, and thus the surge protection performance can be enhanced. Moreover, as described above, the two-layer structure of the ESD protection device 63 enables the enhancement of area efficiency and the downsizing of the semiconductor apparatus 61.

Furthermore, because the ESD protection device 63 is formed in a circular shape in plan view, it can be placed directly below a circular pad, e.g., the gate pad connected to the gate terminal G. Thus the device area can be used more efficiently to further downsize the semiconductor apparatus 61. Moreover, the electrode 51 is placed on the central axis O, and the electrodes 53 are placed at positions with rotational symmetry about the central axis O. Thus the surge current can be passed uniformly. Here, the N⁺-type region 28 is provided with four extensions 28a, and the P-type portion 38, the N-type portion 39, the P-type portion 40, and the N-type portion 41 are not placed directly above the extensions 28a. Hence the electrodes 52 connected to the N⁺-type region 28 can be placed directly above the N⁺-type region 28. Thus the electrodes 52 can be placed at positions with rotational symmetry about the central axis O, allowing the electrodes 52 and the electrodes 53 to be alternately arrayed. Consequently, the electrodes 52 can be interposed in the lower current path C21. Thus, when the diode D1 is turned into the conducting state upon application of a surge voltage between the electrode 51 and the electrodes 53, application of the surge voltage to the gate electrode 77 can be definitely prevented. The effect of this embodiment other than the foregoing is the same as that of the above second embodiment.

Next, a fourth embodiment of the invention is described.

The above third embodiment provides a protection diode structure adapted to an N-channel MOS transistor. In contrast, the fourth embodiment provides a protection diode structure adapted to a P-channel MOS transistor. That is, this embodiment serves to protect a vertical P-channel MOS transistor.

Figure 12:
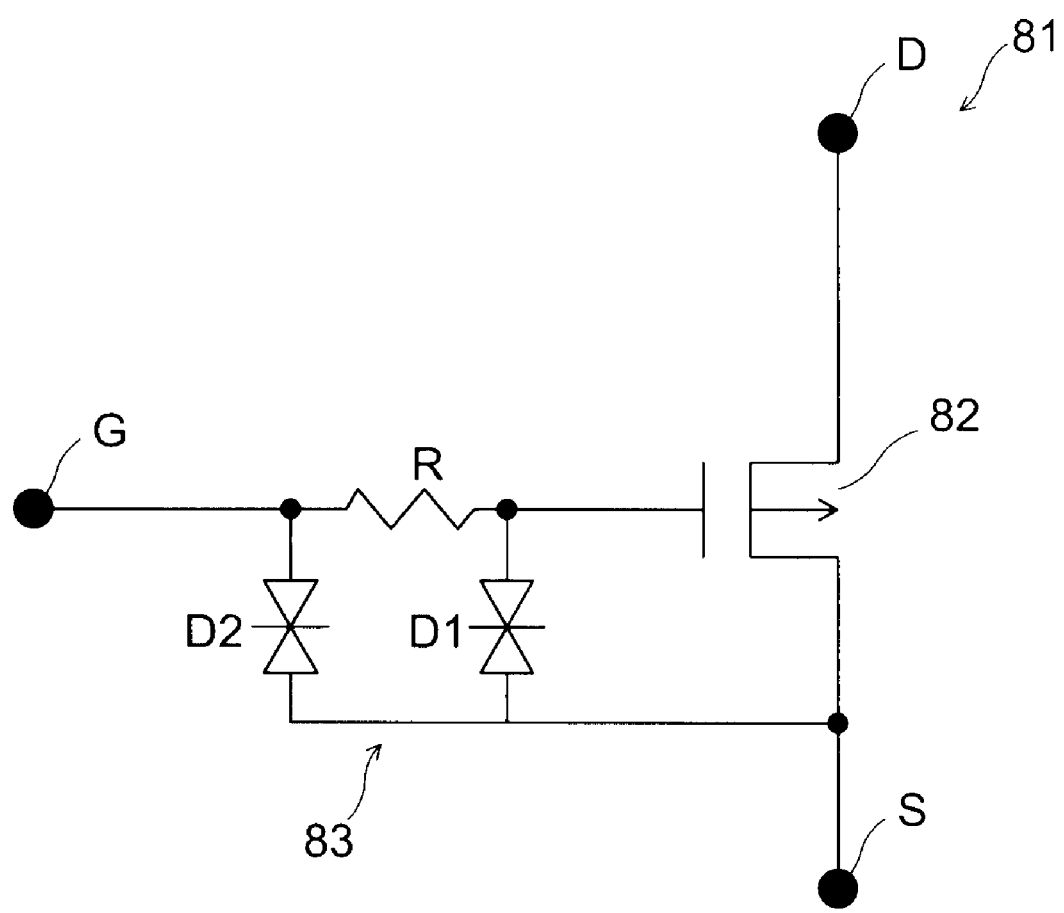
FIG. 12 is a circuit diagram illustrating a semiconductor apparatus according to a fourth embodiment of the invention.

FIG. 12 is a circuit diagram illustrating this semiconductor apparatus.

As shown in FIG. 12, in the semiconductor apparatus 81 according to this embodiment, the shapes, positional relationships, and connections of the components are the same as those in the semiconductor apparatus 61 according to the above third embodiment, but the conductivity type of each component is reversed. More specifically, in the semiconductor apparatus 81, a vertical P-channel MOS transistor 82 and an ESD protection device 83 are formed in a P-type silicon substrate (not shown). Furthermore, as compared with the semiconductor apparatus 61 according to the above third embodiment, the N-type regions and the N-type portions are all replaced by P-type regions and P-type portions, and the P-type regions and the P-type portions are all replaced by N-type regions and N-type portions. The configuration, operation, and effect of this embodiment other than the foregoing are the same as those of the above third embodiment.

The invention has been described with reference to the embodiments. However, the invention is not limited to these embodiments. For example, the above embodiments can be suitably modified through addition, deletion, and/or design change of the components by those skilled in the art without departing from the spirit of the invention, and any such modifications are also encompassed within the scope of the invention.

For example, in the above third and fourth embodiment, the device to be protected is illustratively an N-type or P-type vertical planar MOS transistor. However, the invention is not limited thereto. The device to be protected can also be any other transistors such as a lateral planar MOS transistor, a trench MOS transistor, and a bipolar transistor, or any electronic devices other than transistors. Furthermore, the effect of the invention is also applicable to optical devices including electronic circuits.

Furthermore, in practice, the structure of the protection device can be variously modified. A plurality of stages of diode structures can be arbitrarily combined in the forward or reverse direction. It is also advantageous to arbitrarily combine them in parallel as well as in series. Moreover, bipolar transistor structures or thyristor structures can also be used.

The invention claimed is:

1. A semiconductor apparatus comprising:
a semiconductor substrate;
an insulating film provided on the semiconductor substrate;
a semiconductor film provided on the insulating film;
a first region of a first conductivity type formed in the semiconductor substrate, the first region including:
   a first high-concentration region;
   a second high-concentration region; and
   a low-concentration region placed between the first high-concentration region and the second high-concentration region and having a lower impurity concentration than the first high-concentration region and the second high-concentration region;
a second region of a second conductivity type formed in the semiconductor substrate and being in contact with the second high-concentration region;
a third region of the first conductivity type formed in the semiconductor substrate;
a first portion of the first conductivity type formed in the semiconductor film connected to the first high-concentration region;
a second portion of the second conductivity type formed in the semiconductor film and being in contact with the first portion;
a third portion of the first conductivity type formed in the semiconductor film;
a first electrode connected to the first portion;
a second electrode connected to the second high-concentration region; and
a third electrode connected to the third portion,
the first region being placed in a region including at least part of an area directly below the first portion,
the third region being placed in a region including at least part of an area directly below the third portion and being connected to the third portion,
a first current path extending from the first region through the second region to the third region being formed, and
a second current path extending from the first portion through the second portion to the third portion being formed.

2. The semiconductor apparatus according to claim 1, wherein the first region, the second region, and the third region are placed concentrically with each other, and the first portion, the second portion, and the third portion are placed concentrically with each other.

3. The semiconductor apparatus according to claim 2, wherein a central axis of the first region, the second region and the third region coincides with a central axis of the first portion, the second portion and the third portion.

4. The semiconductor apparatus according to claim 1, wherein
the first region, the second region, and the third region are placed concentrically with each other, and the first portion, the second portion, and the third portion are placed concentrically with each other,
a central axis of the first region, the second region and the third region coincides with a central axis of the first portion, the second portion and the third portion,
the first portion is connected to the first high-concentration region through a first opening formed on the insulating film, and the third portion is connected to the third region through a second opening formed on the insulating film,
the first opening has a circular shape about the central axis viewed from a direction perpendicular to an upper surface of the semiconductor substrate, and
a plurality of the second openings are formed and placed along the circumferential direction of the third region.

5. The semiconductor apparatus according to claim 1, further comprising:
a fourth portion of the first conductivity type formed in the semiconductor film and being in contact with the second portion, and
a fifth portion of the second conductivity type formed in the semiconductor film, placed between the fourth portion and the third portion, and being in contact with the fourth portion and the third portion.

6. The semiconductor apparatus according to claim 1, wherein
the first region, the second region, and the third region are placed concentrically with each other, and the first portion, the second portion, and the third portion are placed concentrically with each other,
a central axis of the first region, the second region and the third region coincides with a central axis of the first portion, the second portion and the third portion,
the first electrode has a circular shape about the central axis viewed from a direction perpendicular to an upper surface of the semiconductor substrate, and the second electrode and the third electrode are placed at positions with n-fold (n is an integer of 2 or more) symmetry about the central axis.

7. The semiconductor apparatus according to claim 6, wherein when viewed from a direction perpendicular to an upper surface of the semiconductor substrate, n extensions extending in a direction away from the central axis are formed at positions of the second high-concentration region with n-fold symmetry about the central axis, the second portion and the third portion constitute n trapezoidal sectors formed by dividing an annulus about the central axis into n portions along a circumferential direction, the second portion and the third portion are not placed directly above the extension, and the second electrode is connected to the extension.

8. The semiconductor apparatus according to claim 7, wherein the n is 4.

9. The semiconductor apparatus according to claim 2, further comprising:

a pad to which an external interconnect is bonded, the first region, the second region, the third region, the first portion, the second portion and the third portion being placed directly below the pad.

* * * * *